(12) United States Patent
Bothra

(10) Patent No.: US 6,710,425 B2
(45) Date of Patent: Mar. 23, 2004

(54) STRUCTURE TO INCREASE DENSITY OF MIM CAPACITORS BETWEEN ADJACENT METAL LAYERS IN AN INTEGRATED CIRCUIT

(75) Inventor: Subhas Bothra, Fremont, CA (US)

(73) Assignee: Zeevo, Inc., Santa Clara, CA (US)

( * ) Notice: Subject to any disclaimer, the term of this patent is extended or adjusted under 35 U.S.C. 154(b) by 0 days.

(21) Appl. No.: 09/844,293

(22) Filed: Apr. 26, 2001

(65) Prior Publication Data

US 2002/0192919 A1 Dec. 19, 2002

(51) Int. Cl.⁷ .................. H01G 4/06; H01L 27/108; H01L 29/94
(52) U.S. Cl. .................. 257/532; 257/700; 257/701; 257/758; 257/300; 257/295; 257/71; 257/68; 257/906; 257/303; 257/296; 361/311; 361/313; 361/321.5; 361/321.4
(58) Field of Search .................. 257/532, 700, 257/758, 300, 295, 71, 68, 906, 303, 296; 361/311, 313, 321.5, 321.4

(56) References Cited

U.S. PATENT DOCUMENTS

| | | | | |
|---|---|---|---|---|
| 4,510,516 A | * | 4/1985 | Bartelink | |
| 5,388,328 A | * | 2/1995 | Yokono et al. | 29/852 |
| 5,506,748 A | * | 4/1996 | Hoshiba | 257/296 |
| 5,536,672 A | * | 7/1996 | Miller et al. | 438/3 |
| 5,973,908 A | * | 10/1999 | Saia et al. | 361/311 |
| 6,078,072 A | * | 6/2000 | Okudaira et al. | 257/295 |
| 6,159,787 A | * | 12/2000 | Aitken et al. | 438/243 |
| 6,190,957 B1 | * | 2/2001 | Mochizuki et al. | 438/240 |
| 6,258,649 B1 | * | 7/2001 | Nakamura et al. | 438/238 |
| 6,281,535 B1 | * | 8/2001 | Ma et al. | 257/295 |
| 6,313,003 B1 | * | 11/2001 | Chen | 438/396 |
| 6,342,734 B1 | * | 1/2002 | Allman et al. | 257/758 |
| 6,391,707 B1 | * | 5/2002 | Dirnecker et al. | 438/250 |
| 6,445,026 B1 | * | 9/2002 | Kubota et al. | 257/296 |
| 6,459,562 B1 | * | 10/2002 | KarRoy et al. | 361/312 |
| 6,483,736 B2 | * | 11/2002 | Johnson et al. | 365/130 |
| 2001/0020713 A1 | * | 9/2001 | Yoshitomi et al. | 257/306 |
| 2002/0038903 A1 | * | 4/2002 | Tsau | 257/532 |

\* cited by examiner

Primary Examiner—Alexander Oscar Williams
(74) Attorney, Agent, or Firm—Townsend and Townsend and Crew LLP

(57) ABSTRACT

A high density MIM capacitor structure and method of manufacturing the same is disclosed for integrated circuits having multiple metal layer interconnections. The capacitor structure is formed between selected first and second metallic interconnections which are separated by an insulating intermetallic oxide layer. A first metal-dielectric-metal layer capacitor is created over and with a portion of the first metallic interconnection and a second metal-dielectric-metal layer capacitor is created under and with a portion of the second metallic interconnection. A first metal via through the insulating intermetallic oxide layer connects the first metal-dielectric-metal layer capacitor and the second metal-dielectric-metal layer capacitor to form a first terminal of the capacitor structure and a second metal via through the insulating intermetallic oxide layer connects the first metallic interconnection portion and the second metallic interconnection portion to form a second terminal of the capacitor structure. Damascene processes are used to manufacture the multiple metal layer interconnections.

8 Claims, 7 Drawing Sheets

STRUCTURE TO INCREASE DENSITY OF MIM CAPACITORS BETWEEN ADJACENT METAL LAYERS IN AN INTEGRATED CIRCUIT

BACKGROUND OF THE INVENTION

The present invention is related to capacitor structures in integrated circuits and, in particular, to metal-insulator-metal capacitor structures in multilayer metal integrated circuits.

Current semiconductor processing technologies have enabled the reduction of sizes of transistors to critical dimensions below 0.25 µm. Critical dimensions are now approaching 0.18 µm and even more aggressive technologies are considering critical dimensions of 0.13 µm. The operating frequencies of the resulting integrated circuits have risen to such an extent that MOSFET (Metal-Oxide-Semiconductor Field Effect Transistor) integrated circuits are being used for RF (Radio Frequency) applications. Such applications typically have analog and RF circuits which require passive elements, such as capacitors. In conventional MOS processes, including CMOS (Complementary Metal-Oxide-Semiconductor, the particular MOSFET technology of choice today), various capacitor structures, such as junction capacitors or gate capacitors, are available. However, these capacitor structures are voltage-dependent and do not meet the performance of a fixed capacitor, which is typically required in analog and RF circuits.

To satisfy this requirement, recent CMOS processes have provided MIM (metal-insulator-metal) capacitor structures which are implemented in the interconnect metallization layers of the integrated circuit. These multiple metallization layers are formed over the semiconductor substrate in which the source and drain regions of the transistors are defined to interconnect various elements of the integrated circuit. A single masking step can be added in the manufacturing process steps used to create conventional metal layers in the integrated circuit to create the capacitors. However, this results in very low density capacitors, i.e., capacitors with relatively low capacitance per unit area. Since the total area of a MIM capacitor can be a significant portion (15%–30%) of the total substrate area of an integrated RF/Analog/Baseband integrated circuit and can be an even larger portion in a CMOS implementation of the radio section only of the integrated circuit, it is necessary to achieve as high an area density of the capacitance as possible for cost minimization.

On the other hand, the present invention provides for MIM capacitor which has a greatly increased capacitor density. Furthermore, the present invention is readily compatible with current semiconductor processing technologies so that CMOS technologies can easily adopt the present invention.

BRIEF SUMMARY OF THE INVENTION

The present invention provides for a high density capacitor structure between adjacent stacked metal layers in an integrated circuit. The metal layers are delineated as interconnections for the integrated circuit. The capacitor structure has a portion of a first selected one of the stacked metal layers and a portion of a second selected one of the stacked metal layers. The second selected stacked metal layer portion is located above and adjacent the first selected stacked metal layer portion. The capacitor structure also has a first capacitor dielectric layer over the first selected stacked metal layer portion; a first capacitor metal plate layer over the first capacitor dielectric layer; a second capacitor dielectric layer under the second selected stacked metal layer portion; a second capacitor metal plate layer under the second capacitor dielectric layer and over and removed from the first capacitor metal plate layer; and a metal capacitor via layer between and connecting said the capacitor metal plate layer and the second capacitor metal plate layer, and a first via connecting the first selected stacked metal layer portion and the second selected stacked metal layer portion. The metal capacitor via layer forms a first terminal of the capacitor structure; and the first via forms a second terminal of the capacitor structure.

The present invention also provides for a method of manufacturing a high density capacitor structure between first and second metallic interconnections of an integrated circuit. The first and second metallic interconnections are separated by an insulating intermetallic oxide layer and the method has the steps of disposing a first metal-dielectric-metal layer capacitor over and with a portion of the first metallic interconnection portion; disposing a second metal-dielectric-metal layer capacitor under and with a portion of the second metallic interconnection; disposing a first metal via through the insulating intermetallic oxide layer to connect the first metal-dielectric-metal layer capacitor and said second metal-dielectric-metal layer capacitor; and disposing a second metal via through the insulating intermetallic oxide layer to connect the first metallic interconnection portion and said second metallic interconnection portion. The first metal via layer forms a first terminal of the capacitor structure and the second metal via form a second terminal of the capacitor structure.

DETAILED DESCRIPTION OF THE INVENTION

Figure 1A:
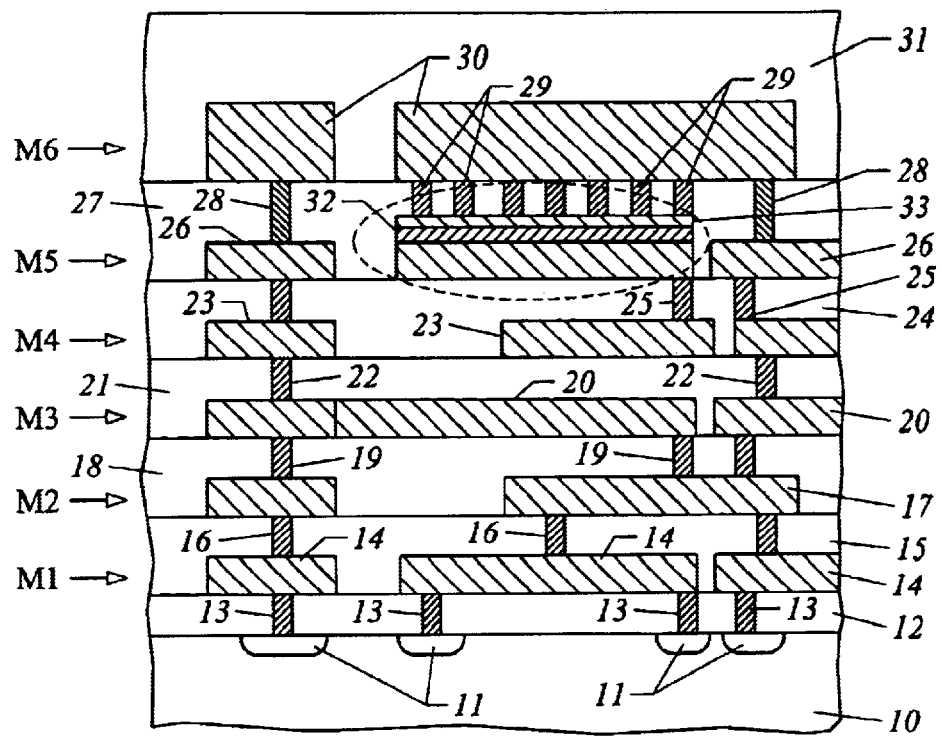
FIG. 1A is a cross-sectional representational view of a current MIM capacitor structure in an integrated circuit manufactured by conventional interconnection metallization CMOS processes.

To illustrate the problem of capacitor density, a capacitor structure in a integrated circuit manufactured by a conventional non-damascene process is shown in FIG. 1A. For purposes of describing the present invention, only the details of the metallization layers forming parts of the capacitor structure are described. Other parts of the integrated circuit are described generally to illustrate the location and problems of the capacitor structure in an integrated circuit. An exemplary six-layer metallization integrated circuit is shown and each metallization layer is labeled M1, for the metallization layer nearest the substrate through M6, the top metallization layer, by terminology common in the semiconductor processing industry.

The exemplary integrated circuit of FIG. 1A is formed on a semiconductor substrate 10 in which active regions 11, such as the source and drain regions of MOS transistors, or substrate conducting regions, are created. To interconnect the regions 11, the metallization layers M1–M6 are formed over the substrate 10. Each metallization layer is formed by one or more stacked metal layers (represented by only one metal layer in FIG. 1A) which are delineated into interconnecting lines over the top surface of substrate 10. Insulating layers electrically isolate the metallization layers from each other with metal vias through the insulating layers making the electrical contacts between metallization layers at selected locations.

In FIG. 1A, an insulating layer 12 covers the substrate 10 with vias 13 making contact between the active regions 11 and the M1 metal layers 14. An insulating layer 15 covers the M1 metal layers 14 and isolates them from M2 metal layers 17. Vias 16 make the connections between the M1 and M2 metal layers 14, 17. In a similar fashion, an insulating layer 19 covers the M2 metal layers 17 and isolates them from M3 metal layers 20; vias 19 make the connections between the M2 and M3 metal layers 17, 20. An insulating layer 21 covers the M3 metal layers 20 and isolates them from M4 metal layers 23; vias 22 make the connections between the M3 and M4 metal layers 20, 23. An insulating layer 24 covers the M4 metal layers 23 and isolates them from M5 metal layers 26; vias 25 make the connections between the M4 and M5 metal layers 23, 26. An insulating layer 27 covers the M5 metal layers 26 and isolates them from M6 metal layers 30; vias 28 make the connections between the M5 and M6 metal layers 26, 30. Finally, a passivation layer 31 covers the M6 metal layers 30 to protect them physically and electrically from the outside world.

Figure 1B:
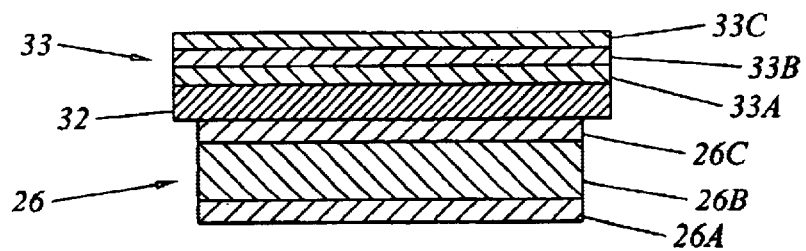
FIG. 1B is a detailed cross-sectional view of the capacitor structure of FIG. 1A.

A MIM capacitor structure which is encircled by a dotted line is created between the M5 and M6 layers. The capacitor structure is created by a capacitor dielectric layer 32 on top of a portion of the M5 metal layer 26 and a capacitor metal layer 33 on top of the capacitor dielectric layer 32. Metal vias 29 connect the capacitor metal layer 33 to the M6 metal layer 30. The details of the capacitor structure is shown in greater detail in FIG. 1B. Note that the M5 metal layer 26 is formed by a stacked sandwich of metal layers 26A–26C, as is the capacitor metal layer 33 by a stacked sandwich of metal layers 33A–33C. These stacked sandwich metallic structures are a result of current semiconductor metallization processes. The metal layers 33A–33C are typically TiN/AlCu/TiN; the M5 metal layers 26A–26C are similarly formed with a thicker AlCu layer.

Figure 2:
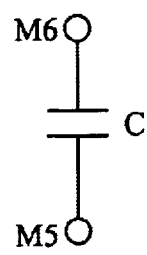
FIG. 2 is an electrical circuit representation of the capacitor structure in FIG. 1A.

The resulting capacitor structure forms a plate capacitor C with its two terminals in the M5 and M6 metallization layers, as represented in FIG. 2. The density of the capacitor C is determined by the thickness of the capacitor's dielectric layer and the layer's dielectric constant, which places limitations on an increase of the capacitor density. The materials readily available as capacitor dielectric material in CMOS process technology are typically $SiO_2$, SiON and SiN, which have relative dielectric constants in a limited range of 4–7. It is tempting to increase the capacitor density by decreasing the thickness of the dielectric layer. However, semiconductor processing limitations, i.e., reliability and thickness control considerations, impose thickness' which are greater than 300 Å. Hence even though a MIM capacitor structure can be manufactured from normal metal layers in a straightforward manner in a standard subtractive etch interconnect process, the result is a very low density capacitor. The capacitance structure shown in FIG. 1A has been used to provide capacitance in the range of 1 $fF/um_2$ (with a dielectric layer having a relative dielectric constant of 4 and a thickness of 350 Å). Hence an increase in the capacitor density in MOS integrated circuits is highly problematical.

Figure 3A:
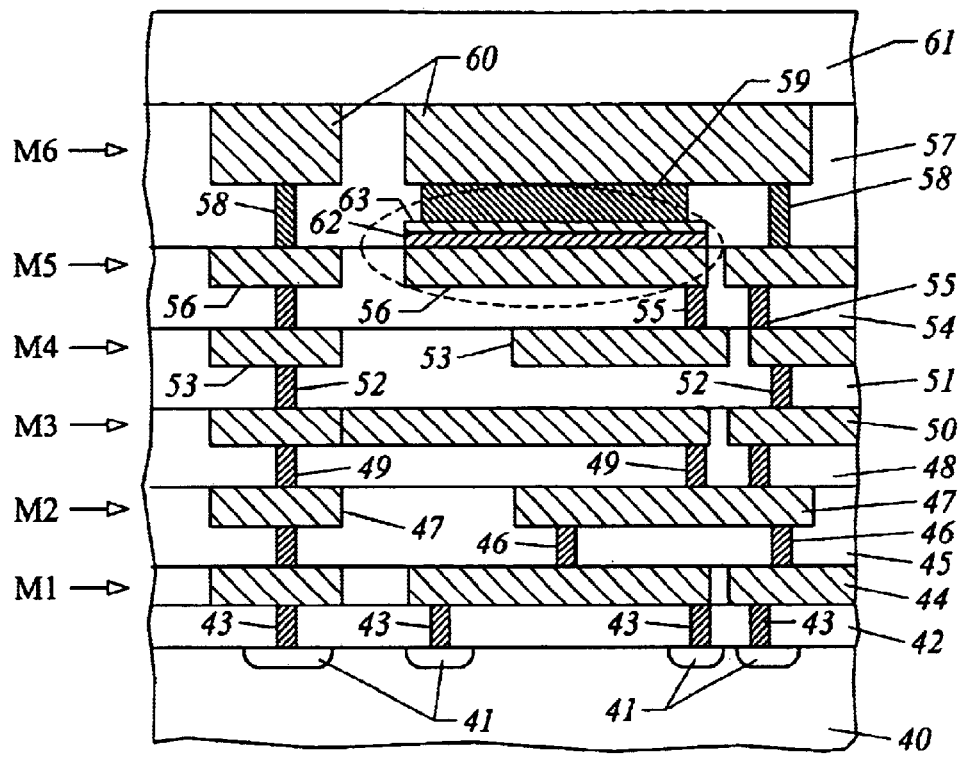
FIG. 3A is a cross-sectional representational view of another current MIM capacitor structure in an integrated circuit manufactured by damascene interconnection metallization CMOS processes.
Figure 3B:
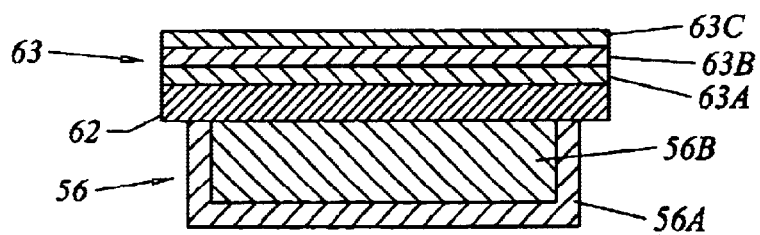
FIG. 3B is a detailed cross-sectional view of the capacitor structure of FIG. 3A.
Figure 5A:
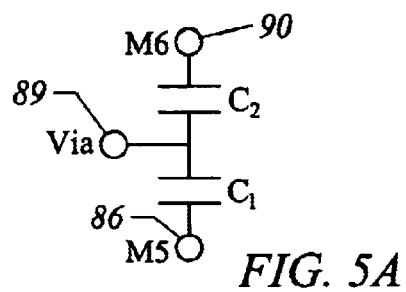
FIG. 5A is an electrical circuit representation of the capacitor structure in FIG. 4A.

Nor are the results improved using more modem damascene processes for the metallization layers of the integrated circuit. FIG. 3A illustrates a current MIM capacitor structure in a integrated circuit manufactured by an exemplary damascene process with the advantage of requiring only one additional masking step. Again, only the details of the inetallization layers forming parts of the capacitor structure are described and the capacitor structure which is encircled by a dotted line is shown in greater detail in FIG. 3B.

An insulating layer 42 covers a substrate 40 with vias 43 making contact between the active regions 41 and the M1 metal layers 44. An insulating layer 45 covers the M1 metal layers 44 and isolates them from M2 metal layers 47. Vias 46 make the connections between the M1 and M2 metal layers 44, 47. In a similar fashion, an insulating layer 49 covers the M2 metal layers 47 and isolates them from M3 metal layers 50; vias 49 make the connections between the M2 and M3 metal layers 47, 50. An insulating layer 51 covers the M3 metal layers 50 and isolates them from M4 metal layers 53; vias 52 make the connections between the M3 and M4 metal layers 50, 53. An insulating layer 54 covers the M4 metal layers 53 and isolates them from M5 metal layers 56; vias 55 make the connections between the M4 and M5 metal layers 53, 56. An insulating layer 57 covers the M5 metal layers 56 and isolates them from M6 metal layers 60; vias 58 make the connections between the M5 and M6 metal layers 56, 60. Finally, a passivation layer 61 covers the M6 metal layers 60 to protect them physically and electrically from the outside world.

The MIM capacitor structure is created by a capacitor dielectric layer 62 on a portion of the M5 metal layer 56 and a capacitor metal layer 63 on the capacitor dielectric layer 62. A metal via 59 connects the capacitor metal layer 63 to the M6 metal layer 60. The details of the capacitor structure is shown in greater detail in FIG. 3B. Note that the M5 metal layer 56 is formed by a Cu layer 56B surrounded by a Ta layer 56A. The capacitor metal layer 63 is a stacked sandwich structure of TiN/AlCu/TiN or Ta/Cu/Ta for the metal layers 63A–63C.

The resulting capacitor structure is still a capacitor between the M5 and M6, as illustrated in FIG. 2. As in the case of capacitor structure of FIG. 1A, the capacitance of the FIG. 3A capacitor structure can only be increased by increasing the area of capacitor plates, i.e., the capacitor portion of the M5 metal layer 56 and the capacitor plate layer 63. As explained above, this results in the undesirable consumption of the integrated circuit's valuable space. A much better result is to increase the capacitor density so that the capacitance of the capacitor structure can be increased without increasing its area.

Figure 4A:
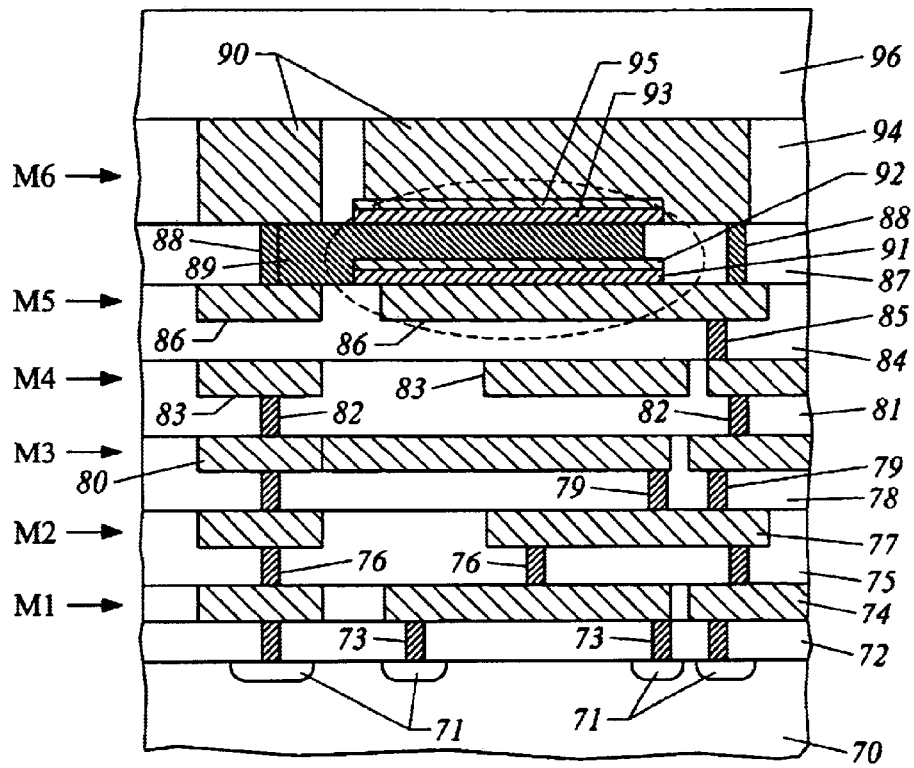
FIG. 4A is a cross-sectional representational view of a capacitor structure in an integrated circuit manufactured by damascene interconnection metallization CMOS processes, according to one embodiment of the present invention.

The present invention provides for just such an increase in capacitor density. FIG. 4A shows a MIM capacitor structure which results in a 2x density improvement over the capacitor structure of FIG. 3A. Only one additional mask step over the interconnect metallization process used in FIG. 3A is required. The disclosed structure is shown in FIG. 4a. The electrical representation of the capacitors obtained is shown in FIG. 5b. With reference to FIG. 4, one terminal of the capacitor is formed at the via metallization and the other terminal is the metal 5/metal 6 which are connected together to give the capacitor shown in FIG. 5b.

In a similar manner as described in the previous drawings, elements 70–86 describe the substrate, active regions, insulating layers, vias and metal layers for the M1 through M5 metallization interconnection layers. An insulating layer 87 separates the M5 metal layer 86 from the M6 metal layer 90 with vias 88 make the connection between the two metal layers 86, 90. Over the M6 metal layer 90 is a passivation layer 96.

Figure 4B:
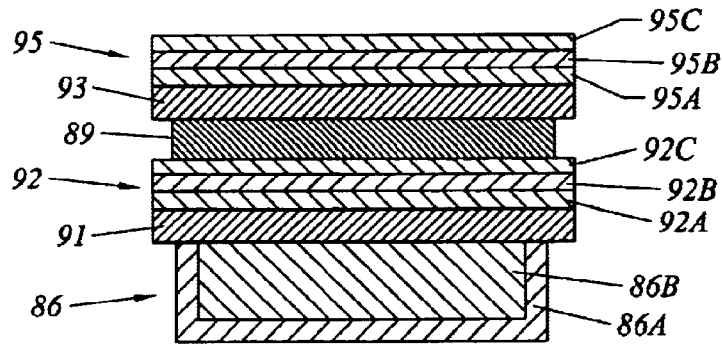
FIG. 4B is a detailed cross-sectional view of the capacitor structure of FIG. 4A.
Figure 5B:
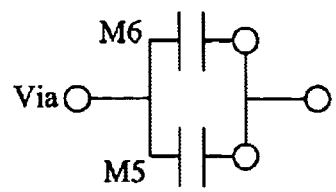
FIG. 5B is illustrates the electrical circuit representation in FIG. 5A as connected in FIG. 4A.

The capacitor structure of which the M5 metal layer 86 is a part is encircled by a dotted line and shown in greater detail in FIG. 4B. A first capacitor dielectric layer 91 is placed on a portion of the M5 metal layer 86 and a first metal capacitor plate layer 92 on the dielectric layer 91. Below a portion of the M6 metal layer 90 above the first capacitor dielectric layer 91 and first metal capacitor plate layer 92 is a second metal capacitor plate layer 95 and a second capacitor dielectric layer 93. A metal via 89 separates (and connects) the first metal capacitor plate layer 92 and the second capacitor dielectric layer 93. FIG. 4B illustrates the composition of some of the elements of the capacitor structure in greater detail. The M5 metal layer 86 is formed by a barrier metal layer 86A of Ta around a Cu metal layer 86B. The first capacitor dielectric layer 91 (and second capacitor dielectric layer 93) is formed by deposited $SiO_2$, SiON or SiN. The first metal capacitor plate layer 92 (and second metal capacitor plate layer 95) is a tripartite sandwich structure of metal layers 92A–92C (and 95A–95C) of TiN/AlCu/TiN or Ta/Cu/Ta. The via 89, like the other vias in the metallization interconnection of FIG. 4A is Cu or W.

The MIM capacitor structure forms two capacitors $C_1$ and $C_2$ as represented in FIG. 5B. The bottom capacitor C1 is connected to the M5 metallization layer 86 and the top capacitor $C_2$ is connected to the M6 metallization layer 90. The via 89, which is actually part of the capacitor structure, connects the two capacitors $C_1$ and $C_2$. Structurally it should be noted that in FIG. 4A a right side via 88 connects the M5 metal layer 86 which has a portion covered by the first dielectric layer 91 to the M6 metal layer 90 which has a portion which covers the second metal capacitor plate layer 95. The via 89 connects to M5 and M6 metal layers 86, 90 which are not part of the capacitor structure. To ensure that connection the via 89 is also connected to a via 88 on the left side of the FIG. 4A drawings. Electrically the two capacitors $C_1$ and $C_2$ form a circuit shown in FIG. 5B. In other words, if the two capacitors $C_1$ and $C_2$ have equal capacitance, the capacitor density is doubled. In the same occupied area, the capacitance is doubled.

The capacitor structure is easily implemented in damascene metallization interconnection processes commonly used in advanced integrated circuits. No new process module developments are required to implement the capacitor disclosed structure.

In a single damascene process, this is demonstrated by Table I which compares M5 metallization through contact pad/etch ally process steps for a standard single damascene process, the same process with a conventional MIM capacitor structure (e.g., FIG. 3A), and the same process with the MIM capacitor structure (e.g., FIG. 4A) according to the present invention.

TABLE I

| Std.Damascene Process | With Conventional MIM cap | With Novel MIM Cap |
|---|---|---|
| M5 Cu CMP | M5 Cu CMP | M5 Cu CMP |
|  | Deposit metal/insulator stack | Deposit insulator/metal stack |
|  | Pattern and etch MIM cap | Pattern and etch MIM cap |
| Deposit SiN barrier/ IMO layer | Deposit SiN barrier/ IMO layer | Deposit SiN barrier/ IMO layer |
| Pattern and etch Via 5 | Pattern and etch Via 5 | Pattern and etch Via5 |
| Deposit Cu seed layer/ barrier | Deposit Cu seed layer/ barrier | Deposit Cu seed layer/ barrier |
| Deposit Cu | Deposit Cu | Deposit Cu |
| CMP Cu | CMP Cu | CMP Cu |
|  |  | Deposit insulator/metal stack |
|  |  | Pattern and etch MIM cap |
| Deposit SiN barrier/ IMOlayer | Deposit SiN barrier/ IMOlayer | Deposit SiN barrier/ IMOlayer |
| Pattern and etch trenches for M6 interconnects | Pattern and etch trenches for M6 interconnects | Pattern and etch trenches for M6 interconnects |
| Deposit Cu seed layer/ barrier | Deposit Cu seed layer/ barrier | Deposit Cu seed layer/ barrier |
| Deposit Cu | Deposit Cu | Deposit Cu |
| CMP Cu | CMP Cu | CMP Cu |
| Deposit SiN barrier/ Passivation | Deposit SiN barrier/ Passivation | Deposit SiN barrier/ Passivation |
| Pattern and etch Pad openings | Pattern and etch Pad openings | Pattern and etch Pad openings |
| Alloy | Alloy | Alloy |

Figure 6A:
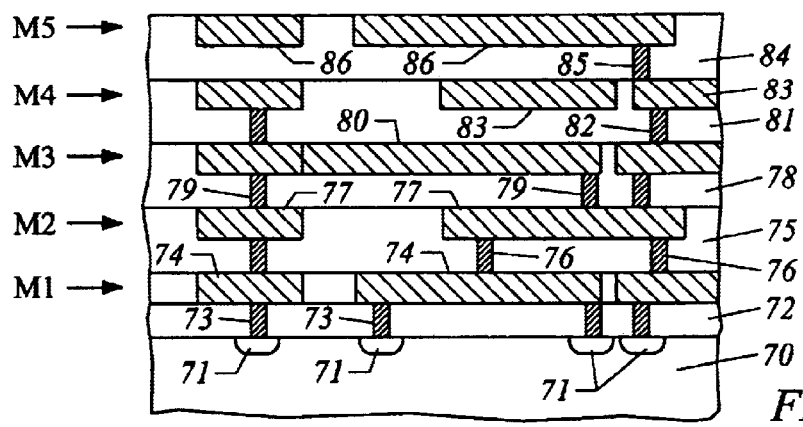
FIGS. 6A–6H illustrate various process steps used in the manufacture of the capacitor structure of FIG. 4A.
Figure 6B:
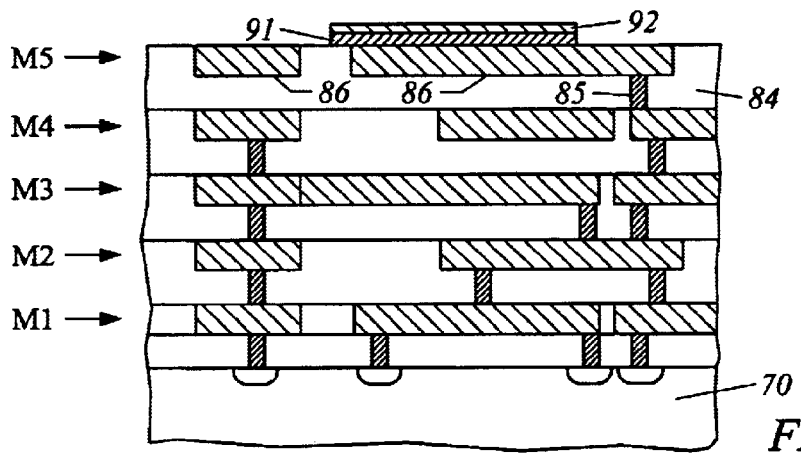
Figure 6C:
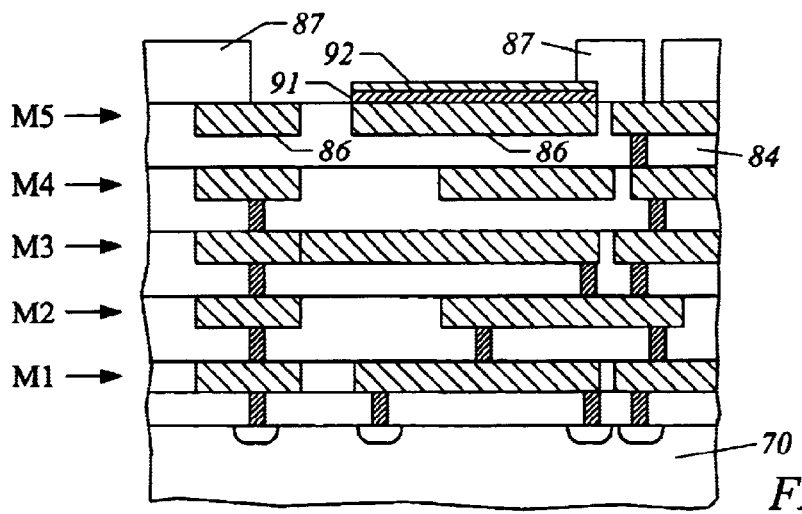
Figure 6D:
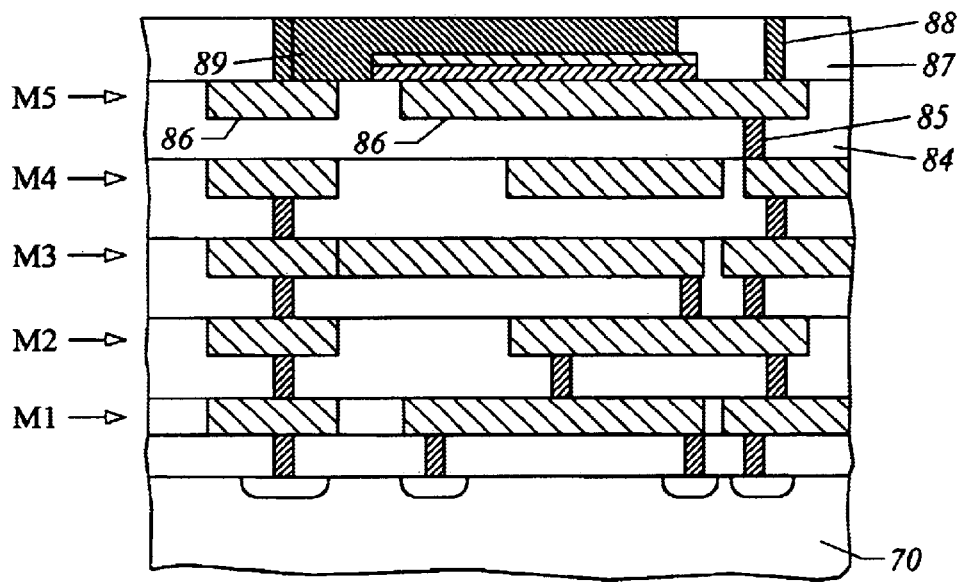

FIGS. 6A–6H illustrate some of the process steps in Table I used to manufacture the novel capacitor structure of FIG. 4A with a single damascene process. FIG. 6A illustrates the results after the M5 Cu CMP (Chemical-Mechanical Polishing) step. After metal insulator/insulator stack is deposited over the defined M5 metal layers 86 and insulating layer 84, MIM capacitor pattern and etch steps are performed to define the first capacitor dielectric layer 91 and first capacitor plate layer 92 illustrated in FIG. 6B. The top of the portion of the M5 metal layer 86 is used as the lower metal capacitor plate. (Alternatively, that the capacitor $C_1$ could be created with a metal insulator/insulator/metal stack deposition steps and followed by MIM capacitor pattern and etch steps to add a separate metal capacitor plate below the dielectric layer 91.) Then an insulating layer 87, formed as a two-layer stack of SiN barrier layer and an IMO (InterMetallic Oxide) layer, is deposited. The apertures, called Via 5 in process table, for the vias 88 and 89 patterned and etched, as shown in FIG. 6C. Then a copper seed or a barrier layer is deposited, which is followed by a copper layer. A CMP process step leaves the metallization as shown in FIG. 6D.

Figure 6E:
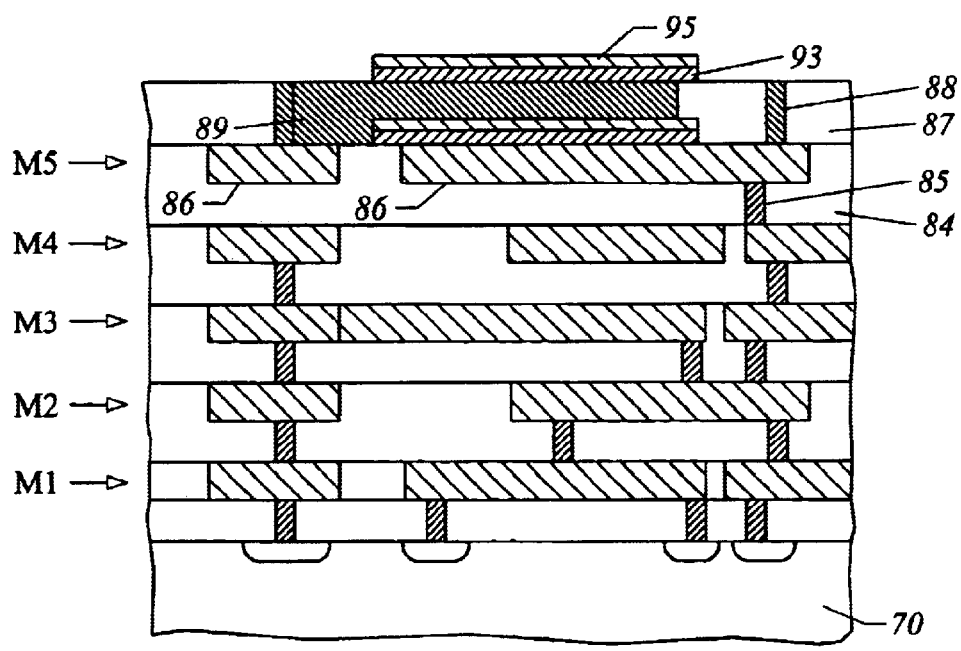
Figure 6F:
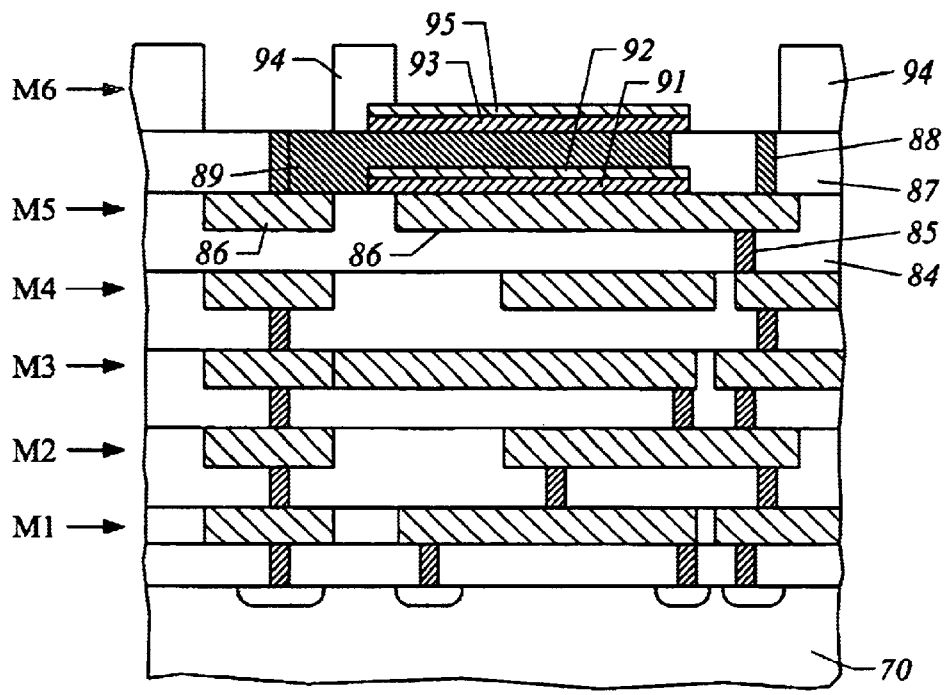
Figure 6G:
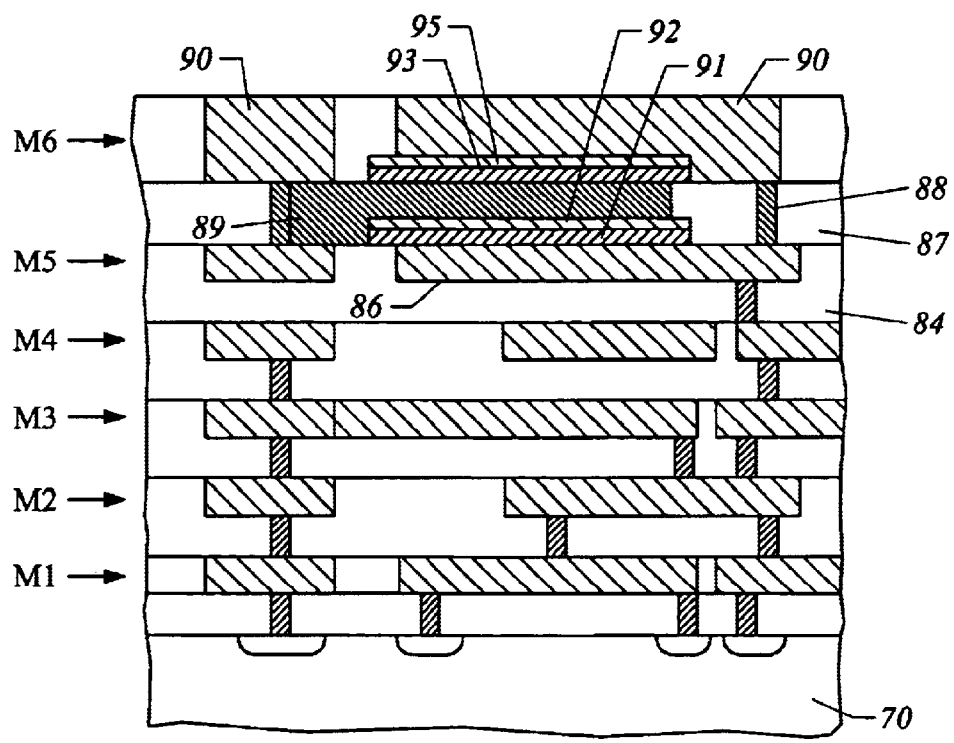
Figure 6H:
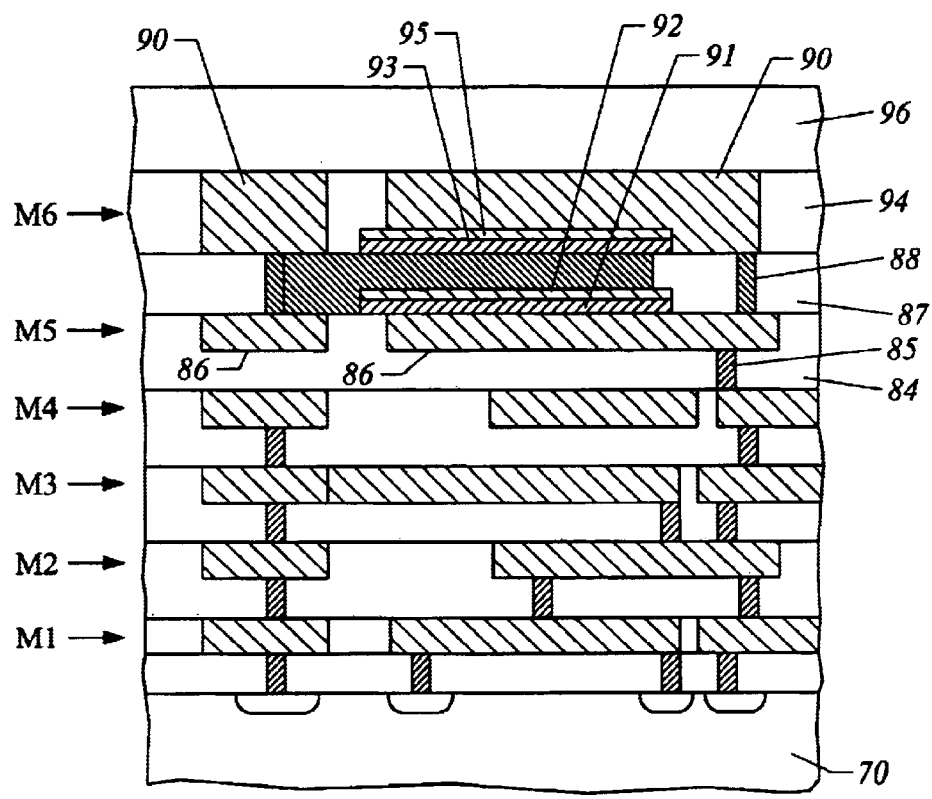

This is followed by capacitor metal insulator/insulator layer stack deposition steps, and the second capacitor dielectric layer 93 and the second capacitor metal plate layer 95 are defined by the MIM pattern and etch steps shown in FIG. 6E. The top of the portion of the via 89 is used as the lower metal capacitor plate. (Again, an alternate embodiment of the capacitor $C_2$ can be created with a separate metal capacitor plate below the dielectric layer 93 by performing capacitor metal insulator/insulator/metal layer stack deposition steps followed by the MIM pattern and etch steps.) FIG. 6F illustrate the metallization after the insulating layer 94, formed as a two-layer stack of SiN barrier layer and an IMO (InterMetallic Oxide) layer, is deposited and the apertures for the eventual M6 metal layers 90 are patterned and etched. To create the M6 metal layers 90, a copper seed or a barrier layer is deposited, which is followed by a copper layer. A CMP process step for the copper leaves the metallization shown in FIG. 6G. Then the passivation layer 96, actually including a barrier SiN layer also, is deposited. Then passivation layer 96 is pattern and etched for the bonding pads and their connections to the metallization interconnection of the integrated circuit and an aluminum alloy is deposited. Further process steps are required to complete the integrated circuit but are beyond the scope of the present invention.

It should be evident that various materials or combinations of materials can be used for metallization interconnection and the capacitor structure. The dielectric layer for the MIM capacitor structure may be $SiO_2$ (which can be deposited by a variety of methods, such as PECVD (Plasma-Enhanced Chemical Vapor Deposition), HDP (High Density Plasma), TEOS-Ozone, SACVD (Standard-Atmosphere Chemical Vapor Deposition), etc.), or Silicon-rich $SiO_2$, SiON, SiN, etc. A variety of metallization stack layers can also be used, such as Cu (with barrier layers of Ta, TiN, TaN, etc.); or AlCu (with barrier layers of TiN). For the metal vias, it is possible to use tungsten (W), besides copper (Cu).

The present invention can also be adapted to dual damascene metallization processes. In a dual damascene process flow, the integration of the new MIM capacitor process (in between, say, the M5 and M6 metallization layers) requires that for those steps, i.e., the Via5 and M6 deposition and definition steps, the dual damascene process be replaced by single damascene process. The process flow changes are shown in Table II, which compares M5 metallization through contact pad/etch ally process steps for a standard dual damascene process, the same process with a conventional MIM capacitor structure (e.g., FIG. 3A), and the same process with the MIM capacitor structure according to the present invention.

TABLE II

| Standard Damascene Process | With Conventional MIM cap | With Novel MIM Cap |
| --- | --- | --- |
| M5 Cu CMP | M5 Cu CMP | M5 Cu CMP |
|  | Deposit metal/insulator stack | Deposit insulator/metal stack |
|  | Pattern and etch MIM cap | Pattern and etch MIM cap |
| Deposit SiN barrier/ IMOlayer | Deposit SiN barrier/ IMOlayer | Deposit SiN barrier/ IMOlayer |
| Pattern and etch Via 5 | Pattern and etch Via 5 | Pattern and etch Via 5 |
| Pattern and etch trenches for M6 interconnects | Pattern and etch trenches for M6 interconnects | Pattern and etch trenches for M6 interconnects |
| Deposit Cu seed layer/ barrier | Deposit Cu seed layer/ barrier | Deposit Cu seed layer/ barrier |
| Deposit Cu | Deposit Cu | Deposit Cu |
| CMP Cu | CMP Cu | CMP Cu |
|  |  | Deposit insulator/metal stack |
|  |  | Pattern and etch MIM cap |
|  |  | Deposit SIN barrier/ IMOlayer |
|  |  | Pattern and etch trenches for M6 interconnects |
|  |  | Deposit Cu seed layer/ barrier |
|  |  | Deposit Cu |
|  |  | CMP Cu |
| Deposit SiN barrier/ Passivation | Deposit SiN barrier/ Passivation | Deposit SiN barrier/ Passivation |
| Pattern and etch Pad openings Alloy | Pattern and etch Pad openings Alloy | Pattern and etch Pad openings Alloy |

As can be seen from Tables I and II, the present invention's MIM capacitor structure is highly suitable for a single damascene process. Even in a dual damascene process, the present invention is attractive since all the previous metallization layers M1 through M5 can still be processed with dual damascene steps. In integrated circuits with a large MIM capacitor area, there is still a considerable area and cost savings with the MIM capacitor structure of the present invention.

Therefore, while the description above provides a full and complete disclosure of the preferred embodiments of the present invention, various modifications, alternate constructions, and equivalents will be obvious to those with skill in the art. For example, though the capacitor structure of the present invention has been described as being located between the M5 and M6 metallization layers, it should be understood that other metallization layers can be used also. Thus, the scope of the present invention is limited solely by the metes and bounds of the appended claims.

What is claimed is:

1. In an integrated circuit having a substrate and a plurality of stacked metal layers thereover, said metal layers delineated as interconnections for said integrated circuit, a capacitor structure between adjacent stacked metal layers comprising:
   a portion of a first selected one of said stacked metal layers and a portion of a second selected one of said stacked metal layers, said second selected stacked metal layer portion above and adjacent said first selected stacked metal layer portion;
   a first capacitor dielectric layer over said first selected stacked metal layer portion;
   a first capacitor metal plate layer over said first capacitor dielectric layer;
   a second capacitor dielectric layer under said second selected stacked metal layer portion;
   a second capacitor metal plate layer under said second selected stacked metal layer portion and over and spaced from said first capacitor metal plate layer; and
   a metal capacitor via layer between and connecting said first capacitor metal plate layer and said second capacitor metal plate layer, said metal capacitor via layer forming a first terminal of said capacitor structure; and
   a first via connecting said first selected stacked metal layer portion and said second selected stacked metal layer portion to form a second terminal of said capacitor structure.

2. The integrated circuit of claim 1 wherein at least one of said first or second stacked metal layers comprises a plurality of stacked, contiguous metal layers of differing composition.

3. The integrated circuit of claim 1 wherein said first capacitor dielectric layer and said first capacitor metal plate layer are laterally co-extensive.

4. The integrated circuit of claim 1 wherein said second capacitor dielectric layer and said second capacitor metal plate layer are laterally co-extensive.

5. The integrated circuit of claim 4 wherein said first capacitor dielectric layer, said first capacitor metal plate layer, said second capacitor dielectric layer and said second capacitor metal plate layer are laterally co-extensive.

6. The integrated circuit of claim 1 wherein said metal capacitor via layer is connected to another portion of said second selected stacked metal layer to form a connection to said second capacitor structure terminal.

7. The integrated circuit of claim 1 further comprising a metal layer laterally co-extensive with said first capacitor dielectric layer and said first capacitor metal plate layer, and arranged between said first capacitor dielectric layer and said first selected stacked metal layer portion so that said metal layer forms a plate for said first capacitor.

8. The integrated circuit of claim 1 further comprising a metal layer laterally co-extensive with said second capacitor dielectric layer and said second capacitor metal plate layer, and arranged between said second capacitor dielectric layer and said second selected stacked metal layer portion so that said metal layer forms a plate for said second capacitor.

* * * * *